United States Patent [19]

Laude

[11] Patent Number: 4,639,684
[45] Date of Patent: Jan. 27, 1987

[54] DIFFERENTIAL INPUT STAGE FOR THE REALIZATION OF LOW NOISE AND HIGH PRECISION BIPOLAR TRANSISTOR AMPLIFIERS

[75] Inventor: David P. Laude, Colorado Springs, Colo.

[73] Assignee: Harris Corporation, Melbourne, Fla.

[21] Appl. No.: 668,864

[22] Filed: Nov. 6, 1984

[51] Int. Cl.$^4$ .............................................. H03F 3/45
[52] U.S. Cl. .................................... 330/259; 330/257; 330/258
[58] Field of Search ............... 330/149, 252, 257, 260, 330/261, 259, 258

[56] References Cited

U.S. PATENT DOCUMENTS

| | | |
|---|---|---|
| 3,548,333 | 12/1970 | Bakke et al. |
| 3,551,832 | 12/1970 | Graeme |
| 3,714,600 | 1/1973 | Kuijk et al. |
| 3,790,897 | 2/1974 | Wheatley, Jr. |
| 3,979,688 | 9/1976 | Maidique |
| 3,997,850 | 12/1976 | Gundry ................................. 330/259 |
| 4,007,427 | 2/1977 | Leidich |
| 4,241,315 | 12/1980 | Patterson, III et al. |

FOREIGN PATENT DOCUMENTS 0000611  1/1980  Japan ................................. 330/257

OTHER PUBLICATIONS

"Amplifier Techniques for Combining Low Noise, Precision, and High-Speed Performance," George Erdi; IEEE Journal of Solid-State Circuits, vol. SC-16, No. 6, Dec. 1981, pp. 653–661.

*Primary Examiner*—Eugene R. LaRoche
*Assistant Examiner*—Steven J. Mottola
*Attorney, Agent, or Firm*—Barnes & Thornburg

[57] ABSTRACT

A low noise, high precision differential amplifier has an input bias and noise current cancellation circuit which includes a sensing device connected between common terminals of the differential pair and a reference potential. The sensing device is connected to a feedback circuit for supplying a bias and noise cancellation current to the amplifier inputs. The sensing device is constructed from a pair of matched transistors, which are also matched to the input differential pair. The feedback circuit includes two current mirrors constructed from four identically matched devices. A Darlington pair is located in the collector leg of each input transistor to improve the common mode rejection ratio. Added noise reduction is achieved by implementing the circuit with low surface noise transistors. A preferred embodiment of the circuit includes a resistance network for adjusting the bias voltages on the gates of the low surface noise transistors.

37 Claims, 3 Drawing Figures

DIFFERENTIAL INPUT STAGE FOR THE REALIZATION OF LOW NOISE AND HIGH PRECISION BIPOLAR TRANSISTOR AMPLIFIERS

BACKGROUND AND SUMMARY OF THE INVENTION

This invention relates generally to differential amplifiers and, more particularly, to an improved low noise, high precision differential input stage for an amplifier.

The implementation of a low noise, high precision input stage for a differential amplifier requires that the input DC bias current (i.e., the base current of the differential pair) be reduced. Reductions in input current and the accompanying input current noise level have been realized in some circuits by use of high beta or super beta transistors. These transistors reduce the effect of current shot noise (noise caused by the flow of discrete charges) by simply reducing DC base current due to the increase in transistor beta. This technique does not, however, address the problems associated with what is commonly referred to as 1/f current noise. This phenomenon is thought to be associated with impurities or recombination centers at the surface discontinuities of a transistor. The level of 1/f noise is inversely proportional to frequency and is a particularly significant problem at frequencies below approximately 1 Kilohertz. For frequencies in the sub-hertz region, this noise component can be very large.

Another problem with using high or super beta transistors is that such transistors have higher base spreading resistance, $r_b$. This is a direct result of making the base shallower to increase beta. The increase in $r_b$ results in an increase in input voltage noise, $V_n$, due to thermal effects.

Another approach to the reduction of input noise levels involves the use of input current cancellation circuits. An input bias current cancellation circuit is discussed in the article "Amplifier Techniques For Combining Low Noise, Precision, And High Speed Performance" published in the IEEE Journal of Solid State Circuits, Vol. SC-16, No. 6, pages 653-661 (December 1981). This circuit is shown in FIG. 1 and is described in detail below.

Another input bias current cancellation circuit is shown in U.S. Pat. No. 3,714,600 to Kuijk et al. This patent shows the use of measuring transistors $T_2$ and $T_{22}$ located in the respective collector legs of input transistors $T_1$ and $T_{11}$. The base of each measuring transistor is connected to the current input of a controlled current source, and each base of the input transistors is connected to the current output of the controlled source. A current proportional to the collector emitter current of the input transistor is supplied from the current source to the bases of the input transistors, thus reducing the current demand at the amplifier inputs. Transistors $T_2$ and $T_{22}$ are, however, located in the AC signal path of the amplifier and, due to their finite bandwidth and finite beta, degrade the AC performance of the circuit. These transistors also introduce noise to the AC signal path. As will be described in detail below, the circuit of the present invention includes a bias current cancellation arrangement which does not degrade overall amplifier performance in this manner.

An object of the present invention is to provide a differential amplifier circuit with reduced input current noise over a wide frequency range and, in particular, in the range of frequencies below 1 Kilohertz.

Another object of the present invention is to provide for the reduction of input currents to a differential amplifier while allowing only minimal increases in 1/f noise levels.

A further object of the present invention is to increase the common mode rejection ratio of a differential amplifier having an input current cancellation circuit without causing undesired increases in 1/f noise levels.

An even further object of the present invention is to provide a bias current cancellation circuit in the input stage of a differential amplifier which can be implemented with low surface noise transistors.

A still further object of the present invention is to provide a means for adjusting the bias currents for the low surface noise transistors to further reduce amplifier input current and noise.

These and other objects of the invention are attained in a differential amplifier stage which comprises a differential transistor pair, a biasing circuit, a sensing device connected serially between the commonly connected terminals of the differential pair and a reference potential, and a feedback device, interconnecting the sensing device and the amplifier inputs, for supplying current to the control terminals of the differential transistor pair. The feedback device may include a pair of current mirrors, each having a controlled leg connected to the sensing device and a controllable leg connected to the control terminals of one of the input transistors. The sensing device includes a transistor having first and second terminals serially connected between the common terminals of the differential pair the reference potential, and a control terminal connected to the feedback device. A preferred embodiment of the sensing device includes a second transistor having first, second and control terminals connected, respectively, to the first, second and control terminals of the first transistor. A level shifting diode connects the control terminals of the sensing device transistors to the feedback device.

In another embodiment of the circuit of the present invention, low surface noise transistors are used to implement the circuit. These transistors have a gate electrode which is connected to one of the transistor terminals. In a preferred embodiment, the gate electrodes of the input transistors and the sensing device transistors are connected to a resistance network to provide for adjusting the bias voltage applied to the gates. Adjustment of the resistors is preferably accomplished by a laser trimming technique.

Another feature of the circuit of the present invention is the use of a Darlington transistor pair in the collector legs of the input transistors. The Darlington pair minimizes the effect on the input transistors of variations in $V_{CE}$, while also minimizing the introduction of noise into the circuit.

Other objects, advantages and novel features of the present invention will become apparent from the following detailed description of the invention when considered in conjunction with the accompanying drawings.

DETAILED DESCRIPTION OF THE DRAWINGS

Figure 1:
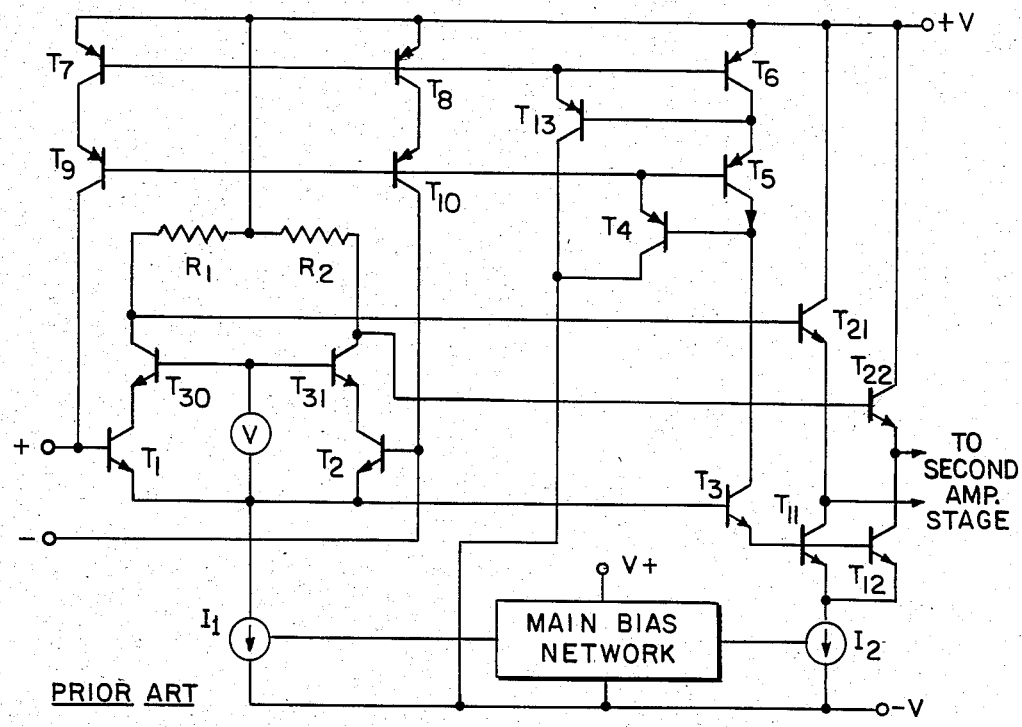
FIG. 1 shows a prior art input bias current cancellation circuit.

FIG. 1 shows a prior art amplifier which includes a differential voltage gain stage made up of $T_1$ and $T_2$, emitter followers $T_{21}$ and $T_{22}$ and input current cancellation devices $T_3$–$T_{13}$. Transistors $T_{21}$ and $T_{22}$ buffer the gain stage against current loading effects of the input to the second gain stage and $T_{11}$ and $T_{12}$ provide a constant current load for $T_{21}$ and $T_{22}$. The bias current cancellation works as follows. The main bias network supplies a reference voltage to current sources $I_1$ and $I_2$. These current sources may be single transistor current sinks with emitter degeneration resistors for DC stability. The current through $I_2$ is set to one-half of the current through $I_1$ by emitter area and resistor ratios which are subject to matching errors. $I_1$ draws nearly equal currents from input devices $T_1$ and $T_2$. These currents result in the flow of base currents into $T_1$ and $T_2$, the magnitude of which depend on the beta of the transistors. Ideally, $T_1$ and $T_2$ have equal betas that also match the betas of $T_{11}$ and $T_{12}$. Thus, the current at the emitter of $T_3$ is equal to the base current of $T_1$ or $T_2$. This current is fed up to a PNP current mirror made up of $T_4$–$T_{10}$ and $T_{13}$. Transistor $T_3$ serves to establish a DC voltage on $I_2$ that is nearly equal to the voltage on $I_1$ for improved matching of currents $I_1$ and $I_2$. Some error will be introduced due to the current drawn by the base of $T_3$. Transistors $T_4$ and $T_{13}$ control the base drive of $T_5$ and $T_6$ such that the emitter current of $T_6$ is nearly equal to the collector of $T_3$. The geometries of $T_7$ and $T_8$ are identical to the geometry of $T_6$, so their emitter currents will be about the same as that of $T_6$ depending upon emitter saturation current match. $T_9$ and $T_{10}$ serve as common base amplifiers which form very high output impedance current sources, each having a current which is ideally identical to the base currents $T_1$ and $T_2$. The flow of these currents into the bases of $T_1$ and $T_2$ result in a relatively small current requirement from the plus and minus inputs to the amplifier. The proper functioning of this circuit depends greatly on maintaining a high degree of matching characteristics among a number of transistors.

Along with the bias current, noise current from the main bias network is also cancelled out by the circuit of FIG. 1. However, $I_1$ and $I_2$ generate their own uncorrelated noise, and devices $T_{11}$, $T_{12}$, $T_3$ and $T_5$–$T_{10}$ also act as noise sources. This noise appears at the input of the amplifier primarily in the form of 1/f current noise and at higher magnitudes than without the bias current cancellation circuitry (each device generates its own uncorrelated noise which adds statistically). To produce higher precision circuits, designers must minimize the DC input current and the input noise current simultaneously.

Another problem with the current cancellation circuit of FIG. 1 is that the collector base capacitance of $T_9$ and $T_{10}$ effectively puts a capacitor from each input of the amplifier to the positive power supply. This capacitance degrades AC stability and AC power supply rejection when the amplifier is driven from a non-zero impedance source.

Furthermore, the input stage of the circuit in FIG. 1 is very susceptible to common mode voltage errors because $V_{CE}$ on $T_1$ and $T_2$ changes as the common mode voltage changes when cascode shields $T_{30}$ and $T_{31}$ are not included in the circuit. This change in $V_{CE}$ results in a small change in $V_{BE}$ of both $T_1$ and $T_2$ because of the EARLY voltage effect. If $V_{BE}$ of $T_1$ is equal to $V_{BE}$ of $T_2$, the input offset voltage is equal to zero and the common mode rejection ratio (CMRR) is very good. However, the mismatch in EARLY voltage usually limits CMRR to 80 db in a typical amplifier, with a small percentage of amplifiers exceeding 100 db. A common improvement is to install cascodes $T_{30}$ and $T_{31}$ in the collectors of $T_1$ and $T_2$ as shown in FIG. 1. These cascodes shield the collectors of $T_1$ and $T_2$ from changing common mode voltages and can boost CMRR to values of 110 db or greater. The problem with using cascode devices $T_{30}$ and $T_{31}$ is that they contribute some DC error in the form of input offset voltage due to their finite beta, and they contribute significantly to 1/f noise because at low frequencies the base current noise becomes large enough to affect the currents to $R_1$ and $R_2$. Noise currents to $R_1$ and $R_2$ cause noise voltages in the second amplifier stage which, in turn, adjust the inverting input to establish equilibrium when implemented in a closed loop system. The adjustment made at the amplifier input is the component of the input voltage noise produced by the current noise of $T_{30}$ and $T_{31}$.

Figure 2:
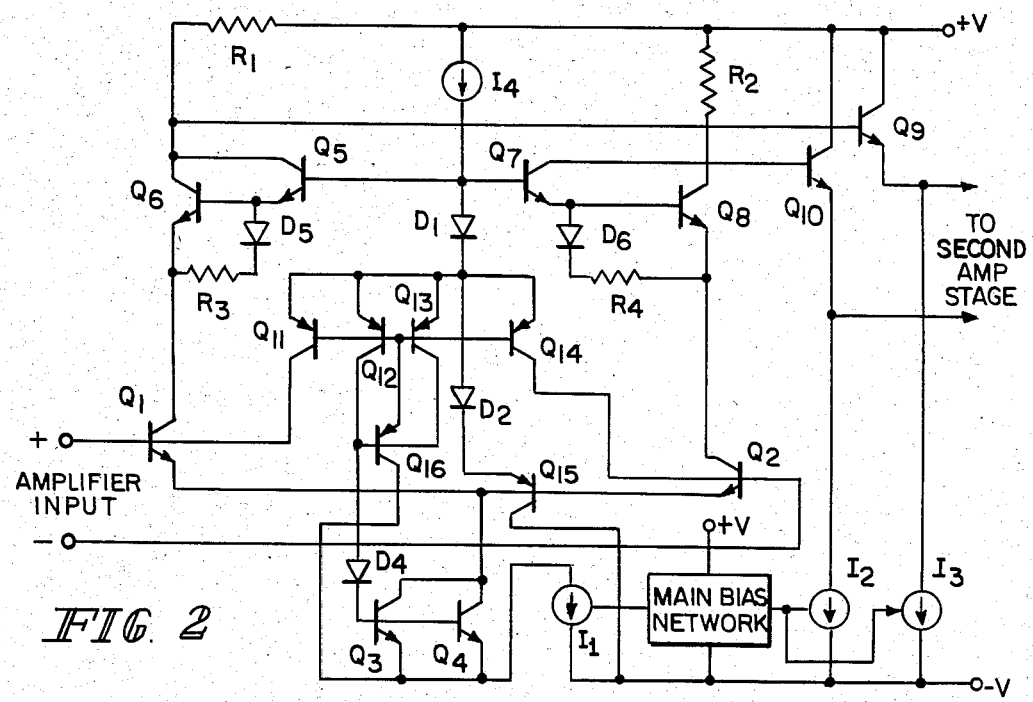
FIG. 2 shows an input bias and noise current cancellation circuit according to the present invention.

FIG. 2 shows the input bias and noise current cancellation circuit of the present invention. The circuit includes an input differential pair, $Q_1$ and $Q_2$, and an input bias current cancellation circuit which works as follows. $I_1$ supplies bias current and noise to the emitters of transistors $Q_3$ and $Q_4$ which serve as a current sensing device. The current from $I_1$ appears at the joined collectors of $Q_3$ and $Q_4$ and serves to bias $Q_1$ and $Q_{2L}$. *Transistors* $Q_3$ and $Q_4$ are identical in geometry to transistors $Q_1$ and $Q_2$ so that the combined base currents of $Q_3$ and $Q_4$ are very nearly equal to the sum of the base currents of $Q_1$ and $Q_2$. The base currents of $Q_3$ and $Q_4$ flow through DC level shift diode $D_4$ to the current mirror made up of $Q_{11}$–$Q_{14}$. The level shift adjusts the $V_{BE}$ of $Q_3$ and $Q_4$ to that of $Q_1$ and $Q_2$ for the best base current match. Furthermore, level shifting prevents saturation of $Q_3$ and $Q_4$ due to insufficient $V_{CE}$. The circuit of FIG. 2 also includes transistor $Q_{16}$ which is connected between the emitters of $Q_3$ and $Q_4$ and the common base terminal of the current mirrors formed by $Q_{11}$–$Q_{14}$. The base of $Q_{16}$ is connected to the collectors of $Q_{12}$ and $Q_{13}$. Transistor $Q_{16}$ provides base drive for $Q_{11}$–$Q_{14}$ resulting in reduced loss of current from $D_4$ to $Q_{12}$ and $Q_{13}$. In an alternative embodiment of the circuit, transistor $Q_{16}$ is omitted and an additional diode is serially connected is series with $D_4$ (see FIG. 3).

The current mirrors are formed from identical transistors $Q_{11}$, $Q_{12}$, $Q_{13}$ and $Q_{14}$. $Q_{12}$ and $Q_{13}$ form the controlled legs of the current mirrors and serve as reference devices for $Q_{11}$ and $Q_{14}$ which form the controllable legs. Since the emitter areas of $Q_{11}$ and $Q_{14}$ are each equal to one-half of the combined emitter areas of $Q_{12}$ and $Q_{13}$, the collector currents of $Q_{11}$ and $Q_{14}$ are one-half of the total base current of $Q_3$ and $Q_4$. The collectors of $Q_{11}$ and $Q_{14}$ are connected to the amplifier inputs (the bases of $Q_1$ and $Q_2$), resulting in cancellation of the base currents which include both bias currents and noise currents from $I_1$. Transistor $Q_{15}$, diodes $D_1$ and $D_2$, and current source $I_4$ provide bias voltages, referenced to the emitters of $Q_1$ and $Q_2$, for the emitters of $Q_{11}$–$Q_{14}$ and the cascode amplifiers (to be discussed below).

The common mode rejection ratio of the circuit shown in FIG. 2 is increased by the cascode amplifier arrangement resulting from placement of Darlington pairs $Q_5$-$Q_6$ and $Q_7$-$Q_8$ in the collector legs of $Q_1$ and $Q_2$, respectively. Use of the Darlington pair, rather than a single transistor, accomplishes the desired shielding of $Q_1$ and $Q_2$ from variations in $V_{CE}$, while introducing less noise than would the single device. Base current noise from $Q_6$ appears almost entirely at the collector of $Q_5$, a common base amplifier, which terminates into $R_1$. Since $Q_5$ is biased at only a few microamps, its base current noise is very small. Diode $D_5$ and resistor $R_3$ serve to bias $Q_5$ at a consistent level since the AC response of $Q_5$ has some bearing on the overall AC response of the circuit. However, this is accomplished without leaking current away from $R_1$. This cascode arrangement causes no appreciable DC error since virtually all the collector current from $Q_1$ is delivered to $R_1$.

The base of $Q_5$ is referenced to the top of $D_1$ which forces the $V_{CB}$ of $Q_1$ and $Q_2$ to be very close to zero volts. A characteristic of this circuit is a reduced common mode range as $Q_5$ and $Q_6$ must have sufficient $V_{CE}$ to operate. About 0.8 volts $V_{CE}$ on $Q_6$ at 25° C. is required as a minimum.

Transistors $Q_9$ and $Q_{10}$ buffer the output and drive the second stage. These transistors generate $1/f$ current noise at the inputs to the second amplifier stage and, therefore, are biased at low current levels.

In summary, the bias current cancellation circuit described above and depicted in FIG. 2 operates by sensing the magnitude of the biasing current established by the main biasing network, via $I_1$, for input transistors $Q_1$ and $Q_2$. The sensing device, in turn, produces a current of proportional magnitude which is equal to the sum of the base currents of $Q_1$ and $Q_2$. This feedback current is divided and mirrored into the bases of $Q_1$ and $Q_2$ by a pair of identical current mirrors. Thus, the bias currents and noise currents induced at the inputs of $Q_1$ and $Q_2$ by the biasing network are cancelled.

There are distinct advantages gained by locating the sensing device as shown in FIG. 2 and by constructing the sensing device from two parallel-connected, identical transistors, $Q_3$ and $Q_4$. With regard to the latter feature, transistors $Q_3$ and $Q_4$ can be matched to the chacteristics of $Q_1$ and $Q_2$, resulting in essentially identical operating characteristics over a wide range of conditions. If a single device were to be used to replace $Q_3$ and $Q_4$, matching characteristics (e.g., temperature drift) could not be maintained to the degree desired. Furthermore, since the base currents of $Q_3$ and $Q_4$ are first combined prior to being divided and mirrored to cancel the base currents of $Q_1$ and $Q_2$, the noise current from the bases of $Q_3$ and $Q_4$ is totally correlated at the amplifier inputs. Thus, with equal impedances connected to the inputs, $Q_3$ and $Q_4$ will not contribute to the overall noise voltage. This would not be the case if $Q_3$ and $Q_4$ were separately connected devices operating in conjunction with $Q_1$ and $Q_2$, respectively.

Further reductions in the level of noise currents can be achieved in the present circuit by use of low surface noise transistors. Such devices are the subject of patent application Ser. No. 518,598 entitled "Method of Fabricating Low Noise Reference Diodes and Bipolar Transistors," also assigned to the present assignee. In a low surface noise transistor, an oxide layer and a shield layer are formed over the emitter base surface junction. The shield layer may be formed of a conductive material. This structure, which may be referred to as a gate, is connected to an electrode and the shield layer is separately biased to affect the noise generated by a forward biased emitter base junction.

Figure 3:
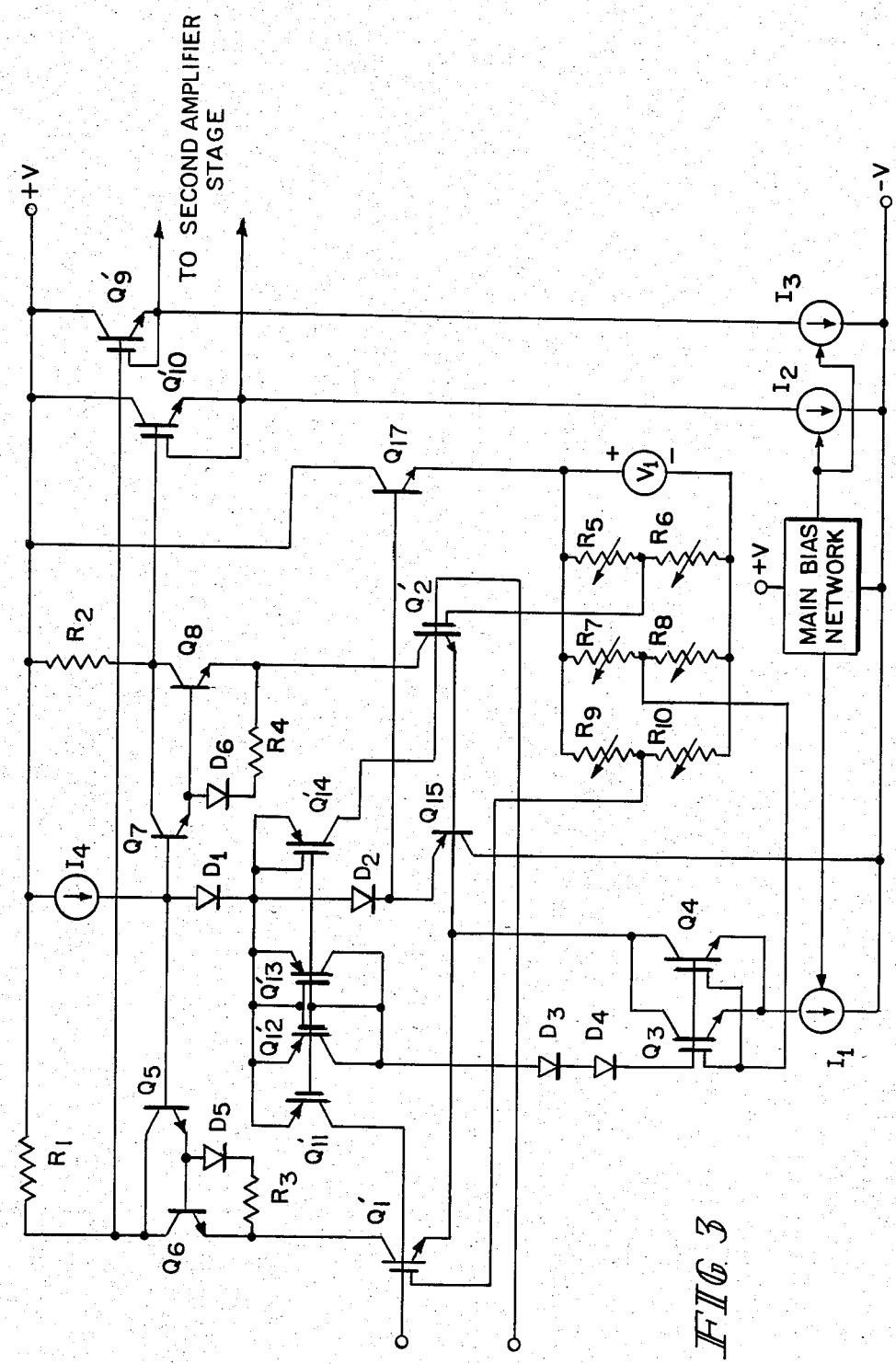
FIG. 3 shows an input bias and noise current cancellation circuit according to the present invention, implemented with low surface noise transistors.

FIG. 3 shows the input bias current and noise current cancellation circuit of FIG. 2 implemented with low surface noise transistors. Note that in the circuit of FIG. 3, transistor $Q_{16}$ has been replaced by diode $D_3$, as alternatively discussed above. The circuit of FIG. 3 also includes optional resistance network $R_5$-$R_{10}$, which will be discussed in detail below.

In FIG. 3, transistors $Q'_1$-$Q'_4$ and $Q'_9$-$Q'_{14}$ are shown as low surface noise transistors. The gate electrodes of transistors $Q'_9$-$Q'_{14}$ are connected to the emitter terminals of those transistors. It has been found that for PNP transistors the best noise performance is achieved with the gate tied to the emitter. This connection also enhances the low current beta of these devices. For NPN transistors, the best noise performance is achieved when the gate is biased at a negative voltage with respect to the emitter. However, significant improvements in the reduction of $1/f$ current noise are realized over prior art devices when the gates are connected to the emitters as shown in FIG. 3.

The gate electrodes of transistors $Q'_1$-$Q'_4$ may also be connected to the emitter terminals of those transistors. However, in the circuit of FIG. 3, a resistance network ($R_5$-$R_{10}$) is provided for adjustment of the bias voltage applied to the gate electrodes of these devices. Since beta increases with decreasing gate bias voltages, extremely small current adjustments can be made by trimming these resistors. The resistor network is powered by $Q'_{17}$ and voltage source $V_1$. Transistor $Q'_{17}$ provides a low impedance reference voltage equal to the emitter voltage of the input pair. $V_1$ may be formed by a zener diode or other circuitry to provide a negative voltage for the gates through voltage dividers $R_5$-$R_6$, $R_7$-$R_8$ and $R_9$-$R_{10}$. These resistors are trimmed by laser to adjust gate bias and, thus, beta and base current of the transistors, in a manner that will result in a current null at both amplifier inputs.

A typical trim procedure involves monitoring both amplifier input currents and noting the polarity of the average current value. If the average is found to be positive, more base current is needed from $Q'_3$ and $Q'_4$. Thus, $R_8$ is trimmed to increase gate voltage and reduce beta. When the average is reduced to zero, the plus input current is also decreased to zero by adjusting $R_9$ to achieve a higher $Q'_1$ beta. The minus input current is also increased to zero by trimming $R_6$ to increase the base current of $Q'_2$. It should be noted that the required range of gate voltage trim to adjust beta match for a given process may severely limit negative common mode range.

From the preceding description of the preferred embodiments, it is evident that the objects of the invention are attained. Although the invention has been described and illustrated in detail, it is to be clearly understood that the same is by way of illustration and example only and is not to be taken by way of limitation. For instance, while the circuit shown in FIG. 2 employs bipolar NPN transistors for the input, sensing and cascode circuits, and PNP transistors for implementing the current mirrors. The use of other functionally equivalent devices or circuits for these applications is contemplated. Accordingly, the spirit and scope of the present invention are to be limited only by the terms of the appended claims.

What is claimed is:

1. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected to said biasing means between said common node and said second reference potential for sensing said biasing current; and
feedback means, interconnecting said sensing means and said stage inputs, for supplying current to the control terminals of the differential transistor pair as a function of said sensed biasing current.

2. A differential amplifier stage according to claim 1, wherein said feedback means includes current splitting means for dividing current received from said sensing means and for supplying current to the control terminals of the differential transistor pair.

3. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential; and
feedback means, interconnecting said sensing means and said stage inputs, for supplying current to the control terminals of the differential transistor pair;
wherein said feedback means includes current splitting means for dividing current received from said sensing means and for supplying current to the control terminals of the differential transistor pair; and wherein said current splitting means includes a first current mirror having a controlled leg connected to said sensing means and a controllable leg connected to the control terminal of a first of said transistor pair, and a second current mirror having a controlled leg connected to said sensing means and a controllable leg connected to the control terminal of a second of said transistor pair.

4. A differential amplifier stage according to claim 3, wherein said current mirrors are formed from four matched transistors.

5. A differential amplifier stage according to claim 3, wherein said sensing means includes a third transistor having first and second terminals serially connected between the common node and the second reference potential and having a control terminal connected to the controlled legs of said first and second current mirrors by level shifting means.

6. A differential amplifier stage according to claim 5, wherein the second terminal of said third transistor is connected to said feedback means by means for supplying current to a common control terminal of a plurality of transistors forming said current mirrors.

7. A differential amplifier stage according to claim 6, wherein said means for supplying current is a transistor having a first terminal connected to the second terminal of the third transistor, and having a second terminal connected to said common control terminal, and having a control terminal connected to said controllable legs of said current mirrors.

8. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential; and
feedback means, interconnecting said sensing means and said stage inputs, for supplying current to the control terminals of the differential transistor pair;
wherein said sensing means includes a third transistor having first and second terminals serially connected between the common node and the second reference potential and having a control terminal connected to said feedback means.

9. A differential amplifier stage according to claim 8, wherein the control terminal of the third transistor is connected to said feedback means by level shifting means.

10. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential; and
feedback means, interconnecting said sensing means and said stage inputs, for supplying current to the control terminals of the differential transistor pair;
wherein said sensing means includes a third transistor having first and second terminals serially connected between the common node and the second reference potential and having a control terminal connected to said feedback means; and
wherein said sensing means further includes a fourth transistor having first and second terminals serially connected between the common node and the second reference potential and having a control terminal connected to said feedback means.

11. A differential amplifier stage according to claim 10, wherein the control terminal of the third transistor is connected to the control terminal of the fourth transistor and said control terminals are connected to said feedback means by level shifting means.

12. A differential amplifier stage according to claim 10, wherein said first and second terminals of said fourth transistor are connected to said first and second terminals of said third transistor.

13. A differential amplifier stage according to claim 10, wherein said differential transistor pair and said third and fourth transistors are matched transistors.

14. A differential amplifier stage according to claim 10, wherein said third and fourth transistors are low surface noise transistors.

15. A differential amplifier stage according to claim 14, wherein a gate electrode of each of said low surface noise transistors is connected to the respective second terminal of each of said low surface noise transistors.

16. A differential amplifier stage according to claim 14, wherein a gate electrode of each of said low surface noise transistors is connected to adjustable resistance means for adjusting a bias voltage on said gate electrodes.

17. A differential amplifier stage according to claim 10, wherein said differential transistor pair are low surface noise transistors.

18. A differential amplifier stage according to claim 17, wherein a gate electrode of each of said low surface noise transistors is connected to the respective second terminal of each of said low surface noise transistors.

19. A differential amplifier stage according to claim 17, wherein a gate electrode of each of said low surface noise transistors is connected to adjustable resistance means for adjusting a bias voltage on said gate electrodes.

20. A differential amplifier stage according to claim 19, wherein said resistance means is adjustable by laser trimming.

21. A differential amplifier stage according to claim 16, wherein said resistance means is adjustable by laser trimming.

22. A differential amplifier stage according to claim 1, further comprising additional amplifying means serially connected between each of said first terminals and said first reference potential.

23. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node and said second reference potential;
sensing means serially connected between said common node and said second reference potential;
feedback means, interconnecting said sensing means and said stage inputs, for supplying current to the control terminals of the differential transistor pair; and
additional amplifying means serially connected between each of said first terminals and said first reference potential;
wherein said additional amplifying means and each of said transistors form a cascode amplifier; and
wherein said additional amplifying means includes a Darlington transistor pair.

24. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential; and
feedback means, interconnecting said sensing means and said stage inputs, for supplying current to the control terminals of the differential transistor pair;
wherein said differential transistor pair are low surface noise transistors and wherein a gate electrode of each of said low surface noise transistors is connected to the respective second terminal of each of said low surface noise transistors.

25. A differential amplifier stage according to claim 24, wherein a gate electrode of each of said low surface noise transistors is connected to adjustable resistance means for adjusting a bias voltage on said gate electrodes.

26. A differential amplifier stage according to claim 25, wherein said resistance means is adjustable by laser trimming.

27. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential; and
feedback means, interconnecting said sensing means and said stage inputs, for supplying current to the control terminals of the differential transistor pair;
wherein said sensing means includes third and fourth transistors, each having first, second and control terminals, and wherein said first terminals are commonly connected, said second terminals are commonly connected, and said control terminals are commonly connected; said third and fourth transistors having the same geometry as said transistors of said differential transistor pair.

28. A differential amplifier stage according to claim 27, wherein said third and fourth transistors are low surface noise transistors.

29. A differential amplifier stage according to claim 28, wherein a garte electrode of each of said low surface noise transistors is connected to the respective second terminal of each of said low surface noise transistors.

30. A differential amplifier stage according to claim 28, wherein a gate electrode of each of said low surface noise transistors is connected to adjustable resistance means for adjusting a bias voltage on said gate electrodes.

31. A differential amplifier stage according to claim 30, wherein said resistance means is adjustable by laser trimming.

32. A differential amplifier stage according to claim 27, wherein said differential transistor pair and said third and fourth transistors are low surface noise transistors.

33. A differential amplifier stage according to claim 32, wherein a gate electrode of each of said low surface noise transistors is connected to the respective second terminal of each of said low surface noise transistors.

34. A differential amplifier stage according to claim 32, wherein a gate electrode of each of said low surface noise transistors is connected to adjustable resistance means for adjusting a bias voltage on said gate electrodes.

35. A differential amplifier stage according to claim 34, wherein said resistance means is adjustable by laser trimming.

36. A differential amplifier stage, comprising:
a differential transistor pair, each transistor having a first and second terminal and a control terminal, each of said first terminals being connected to a first reference potential, each of said control terminals being connected to respective stage inputs, and each of said second terminals being connected together at a common node;
biasing means for causing a biasing current to flow from said common node to a second reference potential;
sensing means serially connected between said common node and said second reference potential;
feedback means, interconnecting said sensing means and said stage inputs, for supplying current to the control terminals of the differential transistor pair; and
level shifting means serially connected between said sensing means and said feedback means.

37. A differential amplifier stage according to claim 36, wherein said level shifting means is a diode.

* * * * *